United States Patent [19]

Yamagishi

[11] Patent Number: 4,654,645

[45] Date of Patent: Mar. 31, 1987

[54] ELECTRIC ELEMENT BREAKDOWN DETECTOR

[75] Inventor: Toshio Yamagishi, Nara, Japan

[73] Assignee: Sharp Kabushiki Kaisha, Osaka, Japan

[21] Appl. No.: 778,003

[22] Filed: Sep. 20, 1985

[30] Foreign Application Priority Data

Sep. 22, 1984 [JP] Japan ................... 59-199288
Sep. 22, 1984 [JP] Japan ................... 59-199289

[51] Int. Cl.⁴ ............................................. G08B 21/00
[52] U.S. Cl. ..................................... 340/635; 324/51; 340/641; 340/652; 340/661
[58] Field of Search ............... 340/635, 640, 641, 652, 340/661, 645; 324/51; 158 MG; 361/88, 92, 93, 98; 307/130, 131

[56] References Cited

U.S. PATENT DOCUMENTS

| | | | |
|---|---|---|---|
| 1,239,795 | 9/1917 | Klipphahn | 340/635 X |
| 2,547,011 | 4/1951 | Jacobsen | 340/635 X |
| 2,625,596 | 1/1953 | Hines | 340/635 X |
| 3,588,891 | 6/1971 | Porter, Jr. | 340/652 X |
| 4,127,887 | 11/1978 | Tanaka et al. | 361/88 X |
| 4,354,182 | 10/1982 | Frey | 340/652 X |
| 4,454,503 | 6/1984 | Konrad | 340/635 X |
| 4,521,769 | 6/1985 | Dudeck et al. | 340/635 |
| 4,538,106 | 8/1985 | Anderson | 340/635 X |
| 4,575,711 | 3/1986 | Suzuki et al. | 340/661 X |

Primary Examiner—James L. Rowland
Assistant Examiner—Daniel Myer
Attorney, Agent, or Firm—Birch, Stewart, Kolasch & Birch

[57] ABSTRACT

An electric element breakdown detector includes an electric element (5: 5a: 106: 132: 172) connected in series with a switching element (6: 6a: 116: 116a: 171) which define a series connection. A processing circuit (40: 110: 174) produces a control signal to the switching element to control on and off operation of the switching element, so as to control the current flow through the series connection. A comparator (10: 119) is provided for comparing a voltage at one end of the electric element with a reference voltage produced from a reference voltage producer (12: 121, 123), and generates a result signal representing the result of the comparison. The result signal is fed to the processing circuit. The processing circuit detects the condition of the series connection by the detection of combination of the control signal and the result signal.

9 Claims, 14 Drawing Figures

ELECTRIC ELEMENT BREAKDOWN DETECTOR

BACKGROUND OF THE INVENTION

1. Field of the Invention

The present invention relates to an electric element breakdown detector and, more particularly, to a circuit which produces a signal when an electric element, such as a coil or a light emitting diode (LED), breaks.

2. Description of the Prior Art

In the electric appliances, such as a copying machine, many electric elements are provided. Taking an example of a copying machine, the electrical circuit of the electromagnetic clutch is employed to control the reciprocating movement of the platform carrying an original document. The electromagnetic clutch has a solenoid coil which is connected in a manner shown in FIG. 1. One end of electromagnetic coil 1 for driving the clutch is connected to the power source (+VB), and the other end thereof is connected to transistor 2 and further to ground. Transistor 2 serves as a switching element. In the above arrangement, when transistor 2 is disabled, a counter electromotive force is generated across electromagnetic coil 1, which may cause a serious damage of transistor 2. To protect transistor 2 from receiving such a voltage, a diode D serving as a voltage dropping element is connected parallel to the electromagnetic coil. Thus, the counter electromotive force generated across electromagnetic coil 1 is absorbed in the diode, thereby preventing transistor 2 from being damaged by the counter electromotive force.

Furthermore, as shown in FIG. 2, when a relay switch 3 is connected in series with electromagnetic coil 1 in lieu of the transistor 2, the counter electromotive force is also absorbed in the diode D so that an electrical discharge will take place between the contacts a and b of the switch 3, and thereby preventing the contacts from being damaged, and also the the generation of noise signals can be eliminated.

In the prior art copying machine, if the platform makes an erroneous movement, it is understood that something is wrong, but it is very difficult to spot the place where the error exists. Sometimes it is not possible to discriminate the place immediately whether the failure is really due to the breakdown of the coil, or whether it is due to some other factor. Thus, much time and labor are required to repair the failure.

The above problem exists not only with the coils but also other electric elements, such as an indicator employing a lamp, a light emitting diode or the like.

Furthermore, the present invention is applicable not only to the copying machine, but also to any machine which employs an electric circuit.

SUMMARY OF THE INVENTION

The present invention has been developed with a view to substantially solving the above described disadvantages and has for its essential object to provide an electric element breakdown detector which produces a signal when the breakdown of the electric element occurs.

It is also an essential object of the present invention to provide a electric element breakdown detector which is simple in structure and can readily be manufactured at low cost.

In accomplishing these and other objects, an electric element breakdown detector according to the present invention comprises a series circuit of a switching element and an electric element, and a comparator having two inputs. One input of the comparator is connected to the series circuit and the other input thereof is connected to a reference level setting circuit which provides a reference voltage to the comparator. The comparator produces an output signal which indicates the breakdown of the electric element.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

Figure 3:
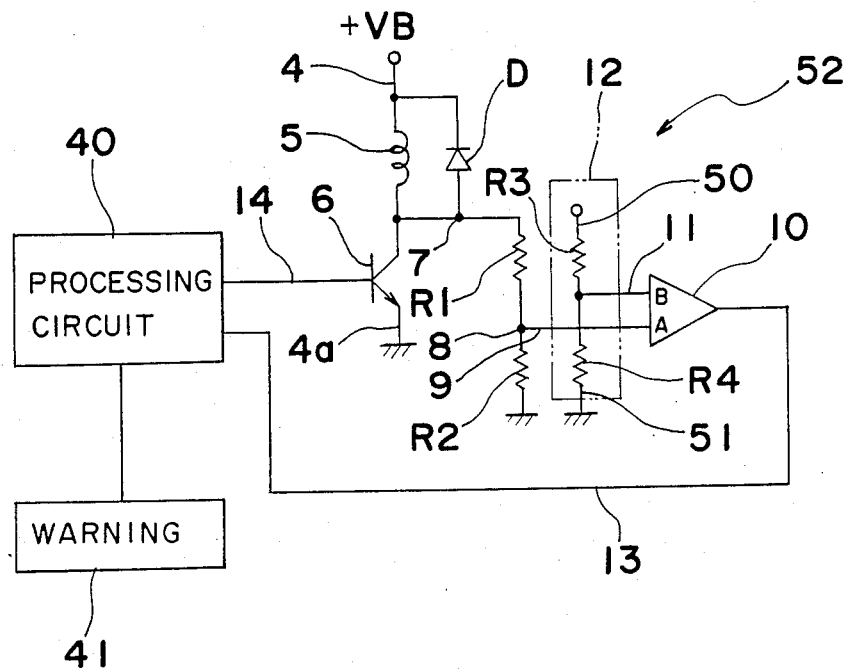
FIG. 3 is a circuit diagram of an electric element breakdown detector according to a first embodiment of the present invention.
Figure 5:
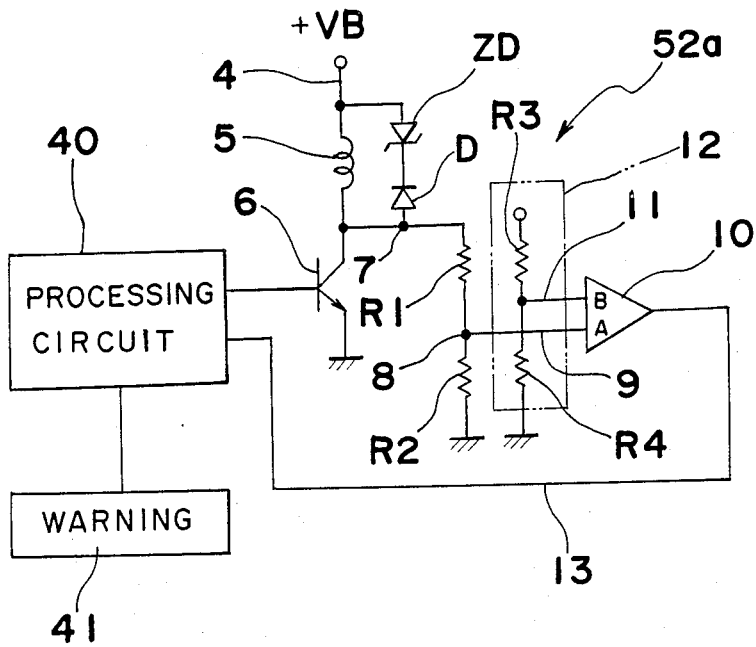
FIG. 5 is a circuit diagram of an electric element breakdown detector according to a second embodiment of the present invention.
Figure 7:
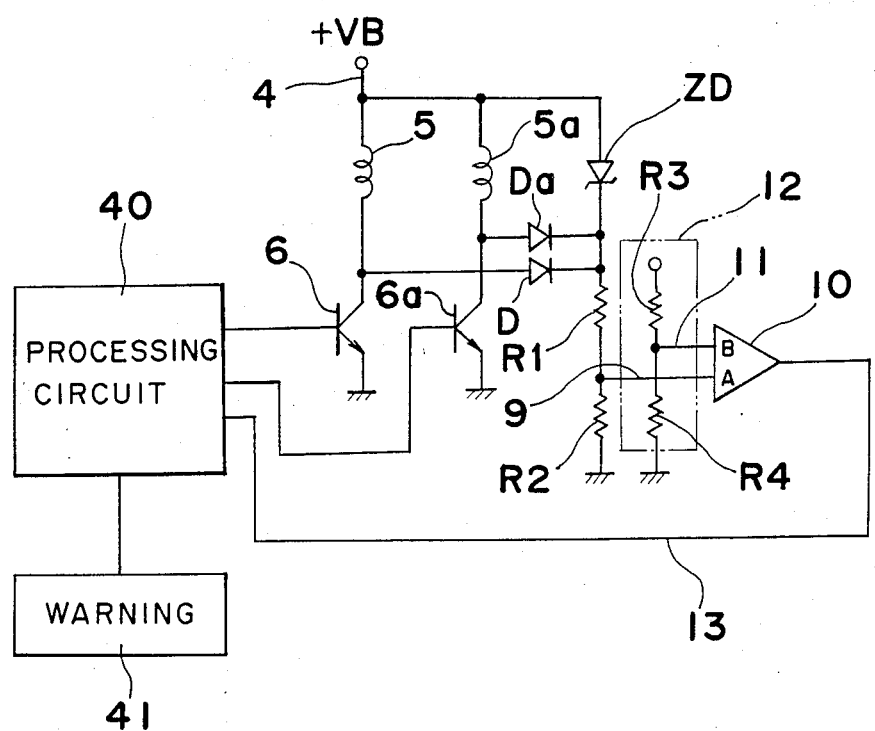
FIG. 7 is a circuit diagram of an electric element breakdown detector according to a third embodiment of the present invention.

In the embodiments of FIGS. 3, 5 and 7, the breakdown detector is arranged to detect the breakdown of an electric element such as a coil. And, in the embodiments of FIGS. 8, 11, 14 and 15, the breakdown detector is arranged to detect the breakdown of an electric element such as a transistor or light emitting diode. Also, as disclosed in some embodiments, the breakdown of a plurality of electric elements can be detected.

Referring to FIG. 3, an electric circuit diagram of a coil breakdown detector 52 according to a first embodiment of the present invention is shown. As shown, a coil 5 and a transistor 6, which serves as a switching element, are connected in series between a power source (+VB) through a line 4 and ground through a line 4a.

Furthermore, a diode D as a voltage dropping element is connected parallel to coil 5. A junction 7 between diode D and the collector of transistor 6 is grounded via resistors R1 and R2 connected in series. A junction 8 between resistors R1 and R2 is connected to an input terminal A of the comparator 10 through a line 9 with the other input terminal B of comparator 10 being connected to a reference voltage setting circuit 12 which is adopted to provide a reference voltage to the input terminal B through a line 11. The reference voltage setting circuit 12 is formed by voltage dividing resistors R3 and R4 which are connected in series between a power source line 50 and a line 51 connected to ground. The comparator 10 operates such that, when the potential at the input terminal A is higher than that at the input terminal B, it generates a LOW level signal, which is equal to the level of the ground, and when the potential at the input terminal A is lower than that at the input terminal B, it generates a HIGH level signal which is equal to the level at line 4 which is connected to the power source (+VB). An output signal from comparator 10 is transmitted, through a line 13, to a processing circuit 40 which is formed by a microcomputer. An output of circuit 40 is connected to the base of the transistor 6.

Figure 1:
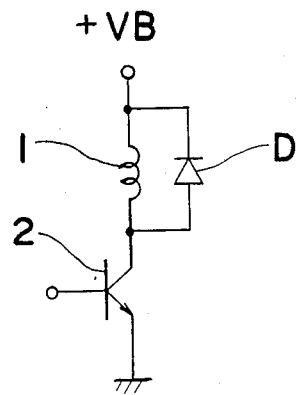
FIGS. 1 and 2 are prior art circuit diagrams showing the connection of a coil representing an electric element and a switching element.
Figure 2:
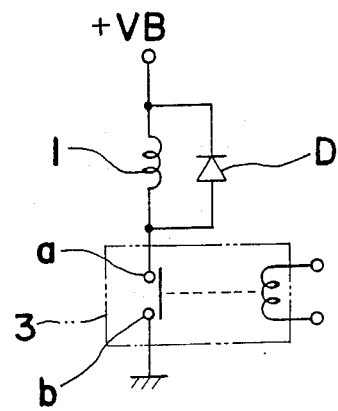
Figure 4:
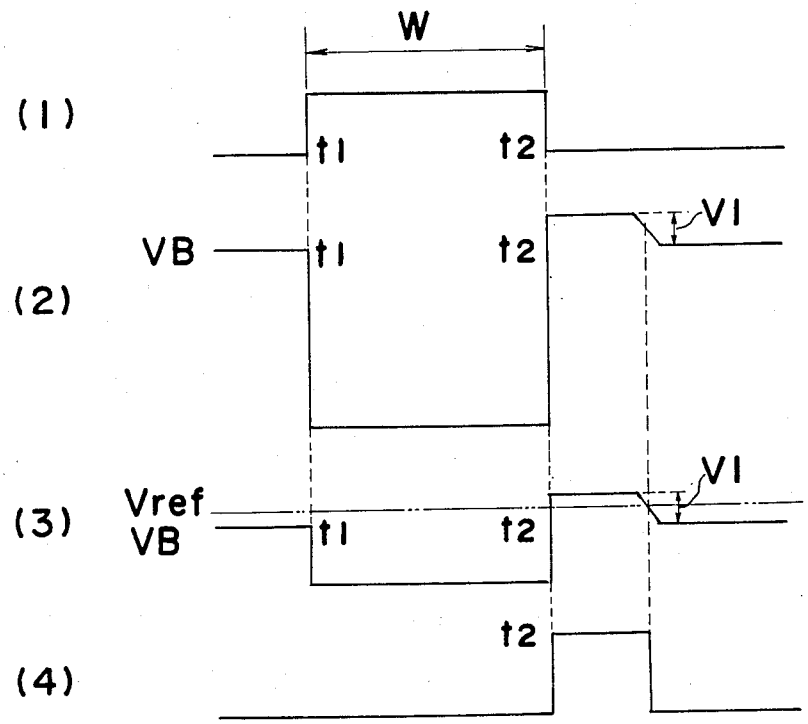
FIG. 4 is a graph showing waveforms obtained from the circuit of FIG. 3.

Assuming a case in which the coil 5 is not broken, the processing circuit 40 will generate a HIGH level signal to the base of transistor 6 during a period W which covers from time t1 to time t2 (FIG. 4). In this case, the transistor 6 becomes conductive only for the period W as shown in FIG. 4 waveform 1. Thus, coil 5 is energized in that period W. When the coil is not broken, the voltage at the anode of the diode D when viewed from the cathode side thereof, that is, the voltage level at junction 7, shoots up, as indicated in FIG. 2 waveform 2, by an amount V1, which is equal to the forward voltage of diode D, in response to the turn off of transistor 6 (time t2) due to the generation of a counter electromotive force. Such voltage V1 is, for example, in the order of 0.5 to 0.7 volt. Thus, at time t2 when transistor 6 is turned off, a voltage VB+V1 is applied to the input terminal A of the comparator 10 through line 9. The other input terminal B of comparator 10 is provided with a reference voltage Vref from the reference voltage setting circuit 12. As indicated in FIG. 2 waveform 3, the reference voltage Vref is so selected as to be lower than the above-mentioned voltage VB+V1 applied to the input terminal A and is higher than the voltage VB. Accordingly, when voltage level at the input terminal A of the comparator 10 is higher than the reference voltage at the terminal B thereof, comparator 10 produces a HIGH level signal, as shown in FIG. 2 waveform 4, indicating that coil 5 is in normal condition. The HIGH level signal produced from comparator 10 is transmitted to a processing circuit 40 where it is detected that coil 5 is operating properly.

Now, it is assumed that the coil 5 is broken. In this case when transistor 6 is tuned on, no current will flow through coil 5 if coil 5 is cut, or a current will flow with a rapid step up if coil 5 is shortcircuited. Thus, at the time when transistor 6 is turned off, a counter electromotive force will not be generated across coil 5. Thus, the voltage at the anode of diode D is maintained at zero voltage. Thus, the input terminal A of comparator 10 receives a LOW level signal equal to the ground potential, whereas the other input terminal B is applied with the reference voltage. In this case, comparator 10 produces a LOW level signal indicating that coil 5 is damaged. The LOW level signal is transmitted to processing circuit where it is detected that coil 5 is broken such that the line constituting the coil is either shortcircuited or cut.

When any breakdown of an electric element is detected in the above described manner, processing circuit 40 produces a warning signal which activates a warning device 41 to produce a visual and/or audible warning in a known manner.

As described above, the breakdown detector of the present invention can detect the breakdown of an electric element, in this case coil 5, can be detected easily by the detection of output signal from comparator 10.

Figure 6:
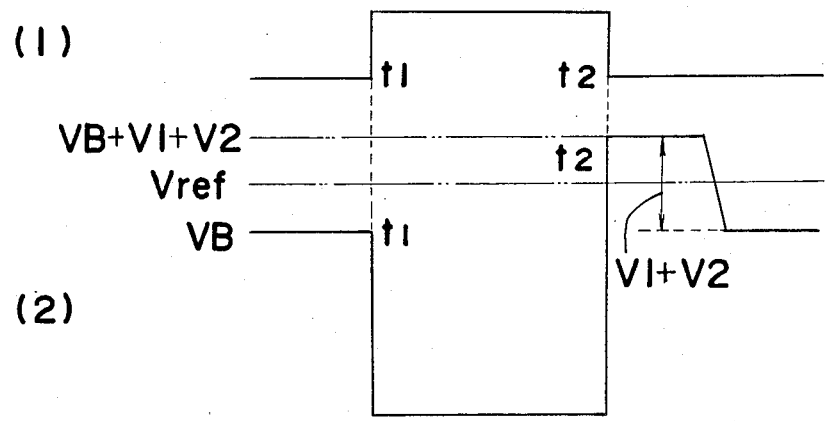
FIG. 6 is a graph showing waveforms obtained from the circuit of FIG. 5.

Referring to FIG. 5, a circuit diagram of a coil breakdown detector according to a second embodiment of the present invention is shown. The outstanding feature of the circuit of FIG. 5 is that a Zener diode ZD is further provided. A series connection of a Zener diode ZD and diode D with their cathodes connected to each other is connected parallel to coil 5. By the connection of Zener diode ZD to diode D, the breakdown voltage V2 (for example, 5 V) of Zener diode ZD is added to the forward voltage V1 of the diode D. Thus, in response to the turn off of transistor 6, if coil 5 is in normal condition, comparator 10 receives at its input A a voltage VB+V1+V2 (FIG. 6, waveform 2) which is much greater than the reference voltage Vref, enabling the comparison in comparator 10 with a high reliance.

When the circuit of FIG. 5 is employed, the breakdown detection may be accomplished even when the voltage produced across diode D is relatively small.

Referring to FIG. 7, a circuit diagram of a coil breakdown detector according to a third embodiment of the present invention is shown. In the third embodiment, it is possible to detect the breakdown of a number of coils 5 and 5a by a single comparator 10. In this embodiment, additional coil 5a, transistor 6a and diode Da are connected in a similar manner to coil 5, transistor 6 and diode D shown in FIG. 5.

It is now assumed that coil 5 is in normal condition and coil 5a is broken. When processing circuit 40 produces a turn-on signal to turn transistor 6 on, a current flows through coil 5. Then when the turn-on signal disappears, a counter electromotive force is generated across coil 5, thereby providing a HIGH level signal to input A of comparator 10. Thus, comparator 10 produces a HIGH level signal indicating that the coil is operating properly. The HIGH level signal from comparator 10 is applied to processing circuit 40. At this time, since processing circuit 40 has completed the turn-on signal for transistor 6, processing circuit 40 detects that the coil that is in normal condition is coil 5.

Next, when processing circuit 40 produces a turn-on signal to turn transistor 6a on, no current will flow through coil 5a when coil 5a is cut, or a current flows with a rapid step up when coil 5a is shortcircuited. In either case, when turn-on signal disappears, no counter electromotive force will be generated across coil 5a, thereby providing a LOW level signal to input A of comparator 10. Thus, comparator 10 produces a LOW level signal indicating that the coil is broken. Then in processing circuit 40, since the turn-on signal at this time was for transistor 6a, processing circuit 40 detects that the coil that is broken is coil 5a.

In this manner, it is possible for the processing circuit to identify the cut or shortcircuited coil by the detection of the output signal from the comparator in a timed relationship with the turn-on signal produced from the processing circuit. Accordingly, even if the number of coil 5 increase, only a single comparator sufficient to detect the breakdown of the particular coil. Thus, the breakdown detector according to the present invention can be formed simply and at a low cost regardless of the number of electric elements which need to be detected.

In the above described embodiments, instead of the transistor a relay switch may be used as a switching element. Furthermore, the term "voltage dropping element" used herein should be construed as including a diode, a combination of a diode and a Zener diode and other elements capable of effecting a voltage drop.

As described above, by the breakdown detector of the above described embodiments, it is possible to detect the breakdown, such as cutting or shortcircuiting, of the coil easily, thereby saving time and labor when the machine requires the exchange of coil.

Figure 8:
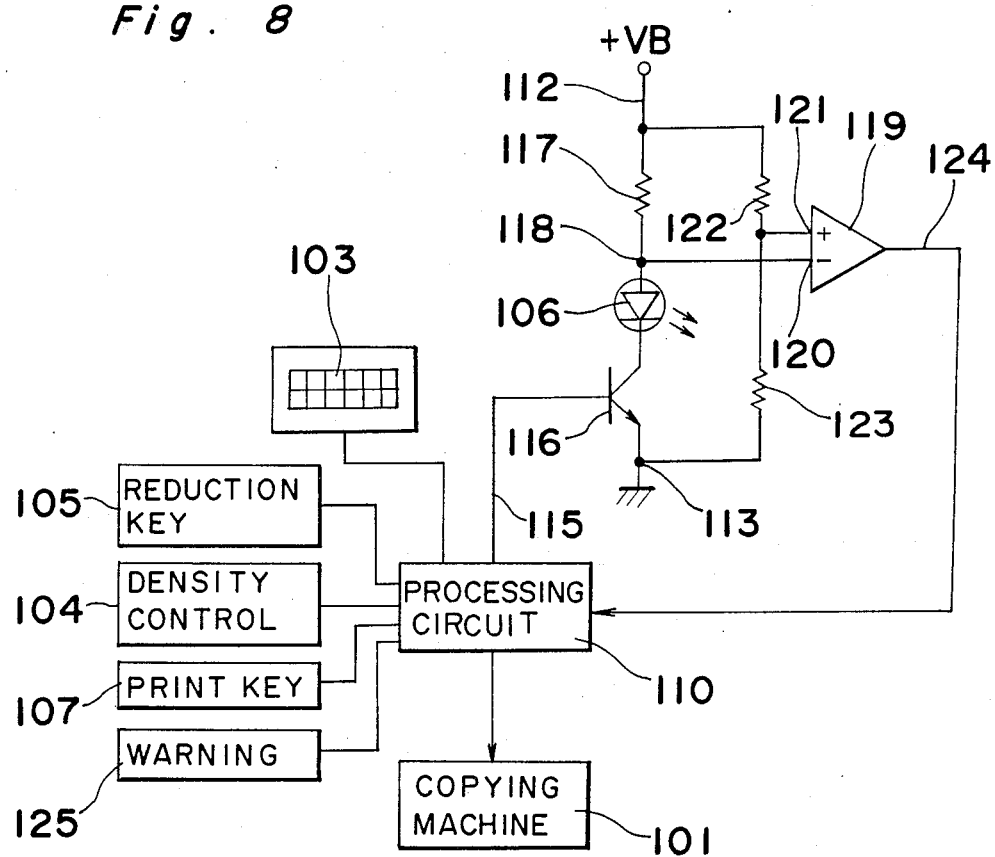
FIG. 8 is a circuit diagram of an electric element breakdown detector according to a fourth embodiment of the present invention.
Figure 9:
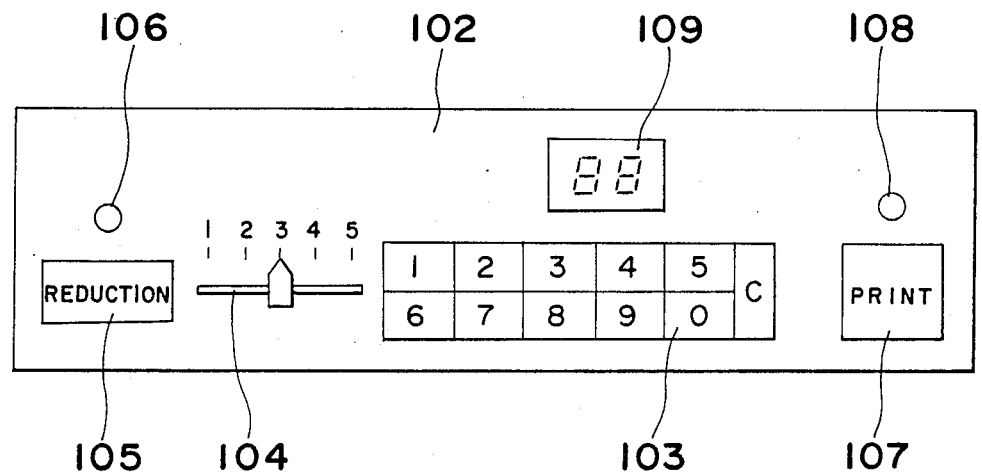
FIG. 9 is a front view of a control panel shown in FIG. 8.

Referring to FIG. 8, a circuit diagram of an electric element breakdown detector according to a fourth embodiment of the present invention is shown. The copying machine generally has a control panel 102 (FIG. 9) which is provided with: touch keys 103 for setting the number of copies to be made; a density control lever 104 for controlling the density of the copy; a reduction key 105 for changing the operation mode between the reduced size copying mode and normal size copying mode; an indicator lamp 106 that turns on when the reduced size copying mode is selected; a print button 107 for starting the printing operation; a power indicator lamp 108 that turns on when the copying operation is being carried out; and a number indicator 109 for indicating the number of copies to be made as deposited by touch key 103 and the number of copies being made during the copying operation.

In operation, first, the number of copies to be made is deposited through touch key 103. The density of the copied paper is controlled by density control key 104. Then, if reduction key 105 is depressed once, the mode changes from the normal size copying mode to reduced size copying mode and, at the same time, indicator lamp 106 turns on. If reduction key 105 is depressed again, the mode return to the normal size copying mode and, at the same time, indicator lamp 106 turns off. Thereafter, when print button 107 is depressed, the copying operation starts and power indicator lamp 108 turns on. The number of copies made is displayed on the indicator 109.

The copying machine further has a processing circuit 110, defined by a microcomputer, which receives command signals from touch key 103, density control key 104, print button 107, and reduction key 105.

When copying machine 101 is in the reduced size copying mode as set by key 105, processing circuit 110 produces a HIGH level signal along line 115 to the base of transistor 116 which serves as the switching element. A series connection of a resistor 117, an LED (light emitting diode) 106, and a transistor 116 is connected between line 112 which is connected to a voltage source +VB and line 113 connected to ground. When a HIGH level signal is applied from processing circuit 110 through line 115, transistor 116 turns on to permit current flow through LED 106. Thus, LED 106 emits light.

On the contrary, when copying machine 101 is in the equal size copying mode as set by key 105, processing circuit 110 produces a LOW level signal to transistor 116. Thus, transistor 116 remains off, thereby maintaining LED 106 tuned off.

A junction 118 between LED 106 and resistor 117 is connected to the inverting input terminal 120 of comparator 119. The non-inverting input 121 of comparator 119 is connected to a reference voltage setting circuit defined by resistors 122 and 123. When the voltage at inverting input 120 applied thereto from junction 118 is lower than the reference voltage at non-inverting input 121, comparator 119 produces a HIGH level signal. But, if the voltage at inverting input 120 is higher than the reference voltage at non-inverting input 121, comparator 119 produces a LOW level signal. The signal produced from comparator 119 is applied to processing circuit 110 through a line 24.

Now, the operations under the normal condition will be described.

During the reduced size copying mode and under the proper operation without any trouble in the electric element, the HIGH level signal transmitted from processing circuit 110 through line 115 is applied to the base of transistor 116 which then turns on to emit light from LED 106. Under this condition, the reference voltage is selected to be higher than the voltage at junction 118. Therefore, the output of comparator 119 produces a HIGH level signal.

On the other hand, during the normal size copying mode and under the proper operation, the LOW level signal from processing circuit 110 is applied to the base of transistor 116. Thus, LED 106 emits no light, thereby maintaining junction 118 at a high level. Under this condition, the reference voltage is selected to be lower than the voltage at junction 118. Therefore, the output of comparator 119 produces a LOW level signal. As apparent from the above, when the signal received from comparator 119 has the same level as the signal produced along line 115, processing circuit 110 judges that the operation is properly carried out with no breakdown in any electric element.

Next, the operations when the electric element, such as transistor 116 or LED 106, is broken will be described.

When transistor 116 is broken such that its emitter collector is shortcircuited, transistor 116 continues to be turned on even when a LOW level signal is applied to its base from processing circuit 110. Thus, LED 106 continues to emit light, and the voltage level at junction 118 is at a LOW level. In this case, since the voltage level at junction 118 is lower than the reference voltage, comparator 124 produces a HIGH level signal, which is the opposite level to the level of the signal produced from processing circuit 110.

When LED 106 is broken such that there is no electric conductivity between its anode and cathode, LED 106 will not emit any light even when a HIGH level signal is applied to the base of transistor 116. Thus, the voltage level at junction 118 is at a HIGH level. Accordingly, since the voltage level at junction 118 is higher than the reference voltage, comparator 124 produces a LOW level signal, which is the opposite level to the level of the signal produced from processing circuit 110.

Thus in processing circuit 110, the proper operation and the error operation caused by the breakdown of transistor 116 or LED 106 are detected using the signal applied to the base of transistor 116 and the signal obtained from comparator 124 in a manner indicated in Table 1 below.

TABLE 1

| Input signal to transistor 16 | Output signal from comparator 19 | Operation |
|---|---|---|
| L | L | Proper |
| H | H | Proper |
| L | H | Error |
| H | L | Error |

When the error operation is detected, processing circuit 110 produces a warning signal which activates a warning device 125 to produce a visual and/or audible warning in a known manner.

Also, when the error is detected, the copying machine may continue to carry out the copying operation based on the original signal as inputted through key 5 or based on the indication of indicator lamp 106.

Figure 10:
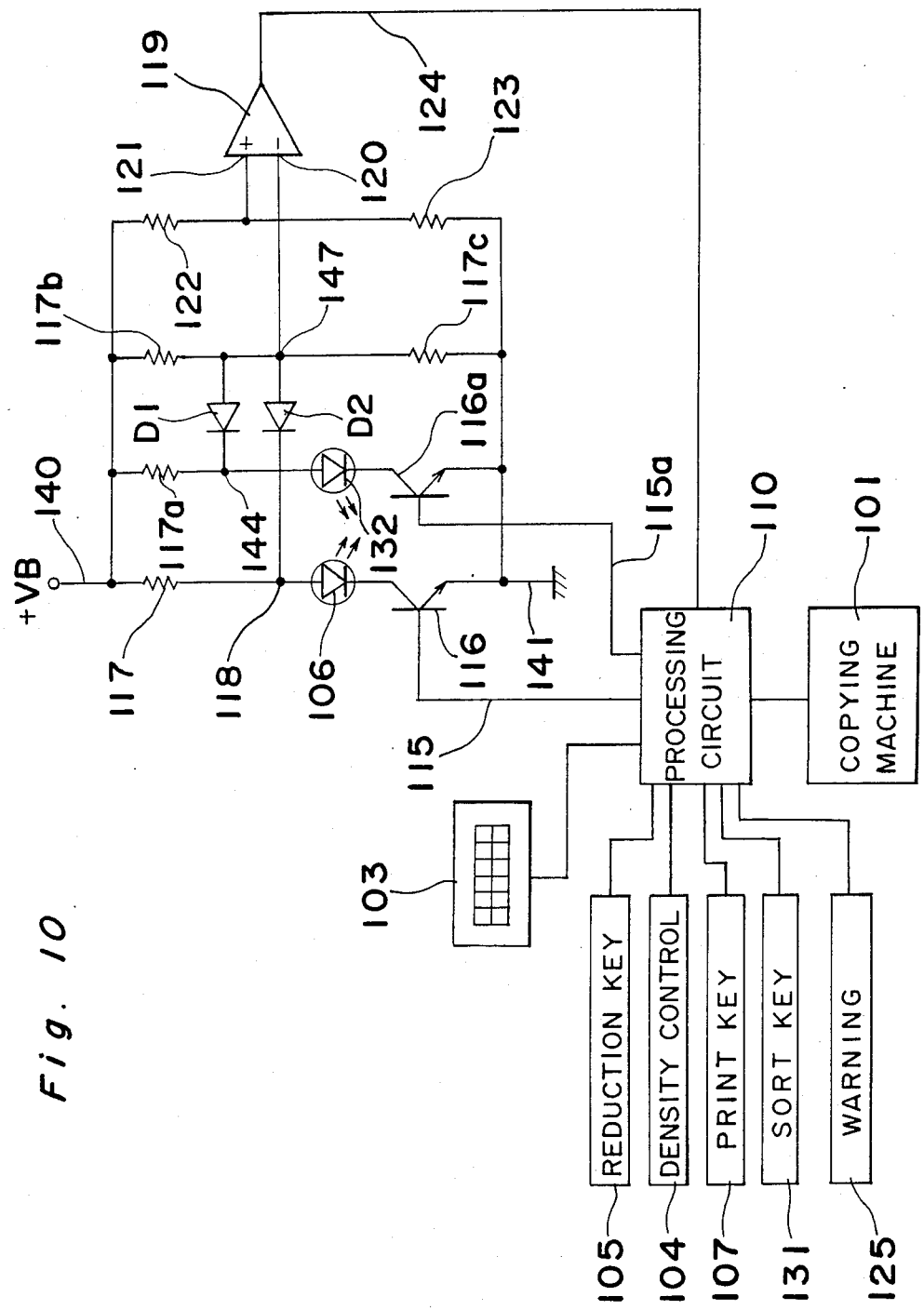
FIG. 10 is a circuit diagram of an electric element breakdown detector according to a fifth embodiment of the present invention.
Figure 11:
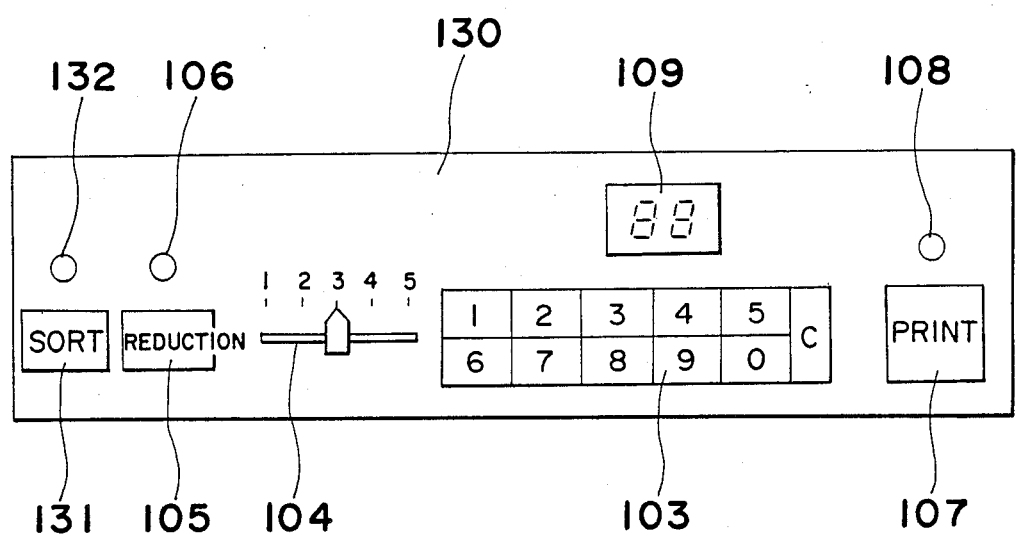
FIG. 11 is a front view of a control panel shown in FIG. 10.

Referring to FIG. 10, a circuit diagram of an electric element breakdown detector according to a fifth embodiment of the present invention is shown. According to this embodiment, copying machine 101 further equipped with a paper sorting device. Thus, as shown in FIG. 11, control panel 130 is further provided with a sort key 131 and a sort indicator lamp 132. When sort key 131 is depressed, the copying machine is set in a sort mode so as to sort the copied papers and, at the same time, sort indicator lamp 132 turns on. When sort key 131 is depressed again, the copying machine is reset to a non-sort mode and, at the same time, sort indicator lamp 132 turns off.

When compared with the circuit of the fourth embodiment shown in FIG. 8, the fifth embodiment of FIG. 10 further has another series circuit of resistor 117a, LED 132 and transistor 116a connected between lines 140 and 141. The base of transistor 116a is connected through a line 115a to processing circuit 110. Furthermore, a series connection of resistors 117b and 117c is connected between lines 140 and 141. A junction 147 between resistors 117b and 117c is connected through a diode D2 to junction 118 between resistor 117 and LED 106, and also, it is connected through a diode D1 to a junction 144 between resistor 117a and LED 132.

Next, the operation of circuit of FIG. 10 will be described. First, it is assumed that LEDs 106 and 132, as well as transistors 116 and 116a, are in the normal condition without any trouble.

When line 115 produces a HIGH level signal to turn transistor 106 on and to energize LED 106, the voltage level at junction 118 becomes low, and so as junction 147. Accordingly comparator 119 produces a HIGH level signal. Similarly when line 115a produces a HIGH level signal, LED 132 turns on to provide a LOW level voltage to junction 147. Thus, comparator 119 produces a HIGH level signal. It is apparent from the above that when at least one of two lines 115 and 115a is provided with a HIGH level signal, comparator 119 produces a HIGH level signal.

Now, it is assumed that LED 106 is broken such that there is no electric connection made between the anode and cathode thereof. In this case, regardless of a HIGH level signal applied through line 115 to transistor 116, LED 106 does not emit any light. Thus, the voltage level at junction 118 is maintained HIGH, and so is the voltage level at junction 144. Accordingly, comparator 119 produces a LOW level signal indicating the error operation.

Next, it is assumed that LED 132 is broken in the same manner as the above. In this case, regardless of a HIGH level signal applied through line 115a, LED 132 does not emit any light. Thus, the voltage level at junction 147 is maintained HIGH, resulting in a LOW level signal produced from comparator 119.

Thus, by the combination of signals produced from lines 115 and 115a and the signal obtained from comparator 119, processing circuit 110 detects the possible breakdown of electric elements in the circuit. Table 2 shows the possible combinations for detecting proper operations and error operations.

TABLE 2

| Signal on line 115 | Signal on line 115a | Output from comparator 19 | Operation |
|---|---|---|---|
| L | L | L | Proper |
| L | L | H | Error |
| L | H | H | Proper |
| L | H | L | Error |
| H | L | H | Proper |
| H | L | L | Error |

Figure 12:
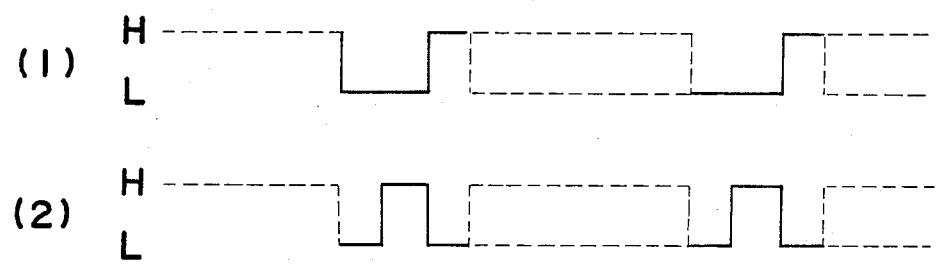
FIG. 12 is a graph showing waveforms produced from a processing circuit for use in the detection of breakdown of the electric element.

When the error operation is detected, processing circuit 110 may detect which one of the two LEDs the error exists in, by detecting the line 115 or 115a from which the HIGH level signal is produced. Instead, it is possible to detect which one of the two LEDs the error exists by using a signal having different frequencies. For example, different frequency signals such as shown in FIG. 12, waveforms 1 and 2, may be used, respectively, to turn transistors 116 and 116a on.

In the case where the error operation is detected, warning device 125 produces a visual and/or audible warning in a known manner.

Figure 13:
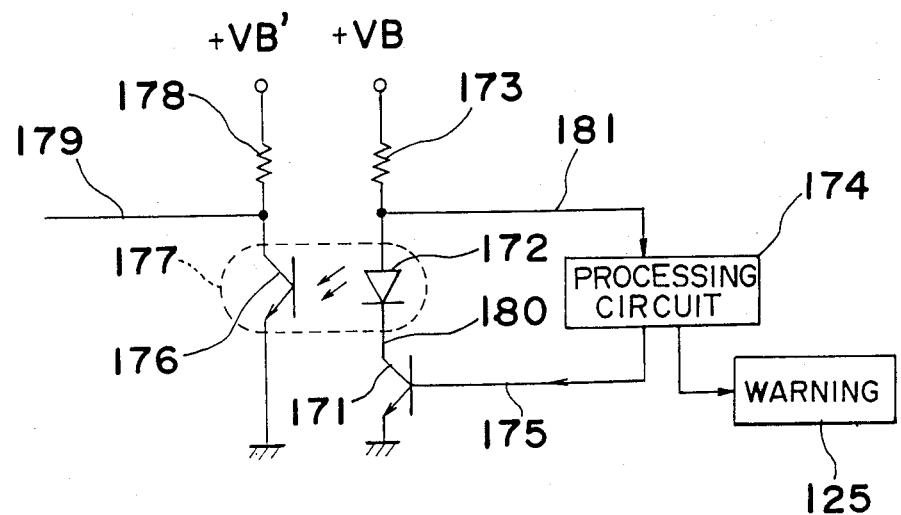
FIG. 13 is a circuit diagram of an electric element breakdown detector according to a sixth embodiment of the present invention.

Referring to FIG. 13, a circuit diagram of an electric element breakdown detector according to a sixth embodiment of the present invention is shown. The circuit of this embodiment comprises a series connection of a resistor 173, an LED 172 and a transistor 171 connected between a power source +VB and ground. A junction between resistor 173 and LED 172 is connected to processing circuit 174 which is in turn connected to the base of transistor 171. The circuit further comprises a series connection of a resistor 178 and a phototransistor 176 connected between a power source +VB' and ground. The LED and the phototransistor defines a photocoupler 177. The signal received by phototransistor 176 may be produced through an output line 179.

According to the sixth embodiment, it is possible to transmit a signal from one circuit having source voltage of +VB to another circuit having a different source voltage of +VB'. Also it is possible to separate these two circuits far away from each other. When they are separated far away from each other, it is preferable to detect whether or not LED 172 is operating properly. To this end processing circuit is provided.

Under the proper operation, if processing circuit 174 produces a LOW level signal through line 175, transistor 171 turns off to stop the light emission from LED 172. Thus, a HIGH level signal is carried on line 181. On the other hand, if processing circuit 174 produces a HIGH level signal through line 175, transistor 171 turns on to effect the light emission from LED 172. Thus, a LOW level signal is carried on line 181. The combinations of signals on lines 175 and 181 under the proper operations are previously stored in processing circuit.

Under the error operation such that transistor 171 is shortcircuited, line 181 will always carry a LOW level signal even when a LOW level signal is produced from processing circuit 174 along line 175. Or, when the error operation is such that LED 172 is broken with no electric connection between its anode and cathode, line 181 will always carry a HIGH level signal even when a HIGH level signal is produced from processing circuit 174 along line 175.

When the error operation takes place, processing circuit 174 produces a signal to warning device 125 which thereupon produces a visual and/or audible warning in a known manner.

Figure 14:
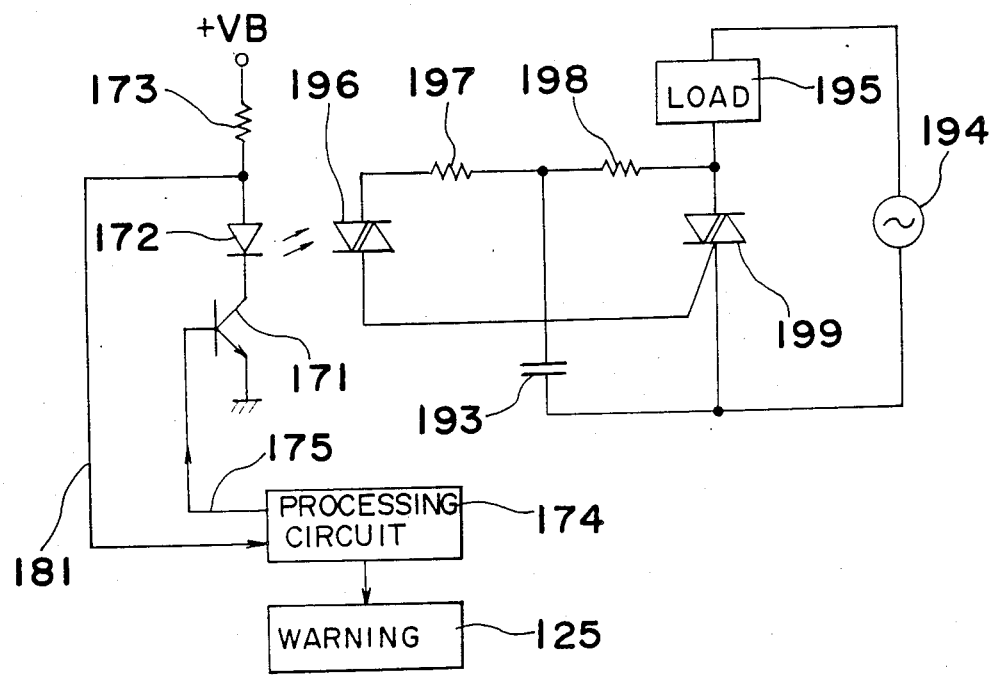
FIG. 14 is a circuit diagram of an electric element breakdown detector which is a modification of the circuit shown in FIG. 13.

Referring to FIG. 14, a modification of an electric element breakdown detector of the sixth embodiment is shown. In the circuit of FIG. 14, a phototriac 196 is employed instead of phototransistor 176. Phototriac 196 is connected in series with resistors 197 and 198 between the gate and one terminal of a triac 199. A load 194 and a triac 199 are connected in series across an AC source 194. Also a capacitor 193 is connected between triac 199 and a junction between resistor 197 and 198. The circuit connected to processing circuit 174 is the same as the circuit of FIG. 13. Thus, the operation for the error detection caused by the breakdown of any electric element is the same as that of the circuit of FIG. 14.

Though in the embodiments described above, a transistor is used for the switching element, but it can be replaced with a relay switch.

Although the present invention has been fully described with reference to a number of preferred embodiments, many modifications and variations thereof will now be apparent to those skilled in the art, and the scope of the present invention is therefore to be limited not by the details of the preferred embodiments described above, but only by the terms of the appended claims.

What is claimed is:

1. An electric element breakdown detector comprising:
   an electric element;
   a switching element connected in series with said electric element to define a series connection;
   a processing circuit means for producing a control signal to said switching element to control on and off operation of said switching element, thereby controlling a current flow through said series connection;
   a reference voltage producing circuit for producing a reference voltage; and
   a comparator means for comparing a voltage at one end of said electric element with said reference voltage, and producing a result signal representing the result of the comparison, said result signal being fed to said processing circuit;
   whereby said processing circuit means detects the condition of said series connection by the detection of combination of said control signal and said result signal.

2. An electric element breakdown detector as claimed in claim 1, wherein said electric element is a coil.

3. An electric element breakdown detector as claimed in claim 2, further comprising a voltage dropping element connected parallel to said coil.

4. An electric element breakdown detector as claimed in claim 3, wherein said voltage dropping element is a diode.

5. An electric element breakdown detector as claimed in claim 3, further comprising a zener diode connected in series to said voltage dropping element.

6. An electric element breakdown detector as claimed in claim 1, wherein said switching element is a transistor.

7. An electric element breakdown detector as claimed in claim 1, further comprising a warning means connected to said processing circuit means for producing a warning when an error operation caused by the breakdown of said electric element is detected.

8. An electric element breakdown detector as claimed in claim 1, further comprising another series connection of electric element and said switching element, said another series connection being connected parallel to said first mentioned series connection.

9. An electric element breakdown detector as claimed in claim 1, wherein said electric element is a light emitting diode.

* * * * *